(12) United States Patent
Queens et al.

(10) Patent No.: US 10,684,557 B2
(45) Date of Patent: Jun. 16, 2020

(54) METHOD FOR ADJUSTING ACTUATION OF A LITHOGRAPHIC APPARATUS

(71) Applicant: ASML NETHERLANDS B.V., Veldhoven (NL)

(72) Inventors: Rene Marinus Gerardus Johan Queens, Boise, ID (US); Emil Peter Schmitt-Weaver, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/085,608

(22) PCT Filed: Apr. 4, 2017

(86) PCT No.: PCT/EP2017/057971
§ 371 (c)(1),
(2) Date: Sep. 17, 2018

(87) PCT Pub. No.: WO2017/178285
PCT Pub. Date: Oct. 19, 2017

(65) Prior Publication Data
US 2019/0094713 A1 Mar. 28, 2019

(30) Foreign Application Priority Data
Apr. 15, 2016 (EP) .................................... 16165605

(51) Int. Cl.
*G06F 3/00* (2006.01)
*G03F 7/20* (2006.01)
*G03F 9/00* (2006.01)

(52) U.S. Cl.
CPC ...... *G03F 7/70641* (2013.01); *G03F 7/70625* (2013.01); *G03F 9/7026* (2013.01)

(58) Field of Classification Search
CPC ............. G03F 7/70625; G03F 7/70633; G03F 7/70641; G03F 1/36; G03F 1/84;
(Continued)

(56) References Cited

U.S. PATENT DOCUMENTS

2006/0033921 A1   2/2006   Den Boef et al.
2009/0231563 A1   9/2009   Staals et al.
(Continued)

FOREIGN PATENT DOCUMENTS

CN    101533228    9/2009
JP    2016048399   4/2016
(Continued)

OTHER PUBLICATIONS

International Search Report and Written Opinion issued in corresponding PCT Patent Application No. PCT/EP2017/057971, dated Jun. 29, 2017.
(Continued)

*Primary Examiner* — Binh C Tat
(74) *Attorney, Agent, or Firm* — Pillsbury Winthrop Shaw Pittman LLP

(57) ABSTRACT

A lithographic apparatus is a machine that applies a desired pattern onto a substrate, usually onto a target portion of the substrate. A functional relationship between local height deviations across a substrate and focus information, such as a determined focus amount, is determined for a substrate, e.g., a reference substrate. Height deviations are subsequently measured for another substrate, e.g. a production substrate. The height deviations for the subsequent substrate and the functional relationship are used to determine predicted focus information for the subsequent substrate. The predicted focus information is then used to control the lithographic apparatus to apply a product pattern to the product substrate.

21 Claims, 7 Drawing Sheets

(58) Field of Classification Search
CPC ........ G03F 7/70683; G03F 7/705; G03F 1/44; G03F 7/70441; G03F 7/70533; G03F 7/70608; G03F 7/70616; G03F 7/7065; G03F 7/70666; G03F 7/70516; G03F 1/68; G03F 7/70433; G03F 7/70691; G03F 1/28; G03F 7/706; G03F 7/7085; G03F 9/7011; G03F 9/7019; G03F 9/7042; G03F 1/78; G03F 7/70283; G03F 7/70733; G03F 9/7046; G03F 9/7049; G03F 9/7076; B82Y 40/00; H01J 37/045; H01J 37/3172; H01L 29/66659; H01L 21/76267; H01L 21/28123; H01L 21/67253; H01L 23/544; H01L 23/58; G06T 2207/30148; G06T 7/0006; G06F 30/30; G06F 30/39; G06F 2119/18; G06F 30/00; G06F 30/20; G06F 30/333; G06F 30/398
USPC ...................................... 716/50–56
See application file for complete search history.

(56) References Cited

U.S. PATENT DOCUMENTS

| | | | |
|---|---|---|---|
| 2010/0122225 A1* | 5/2010 | Cao .................. | G03F 1/14 716/136 |
| 2010/0201963 A1 | 8/2010 | Cramer et al. | |
| 2010/0328655 A1 | 12/2010 | Den Boef | |
| 2011/0027704 A1 | 2/2011 | Cramer et al. | |
| 2011/0043791 A1 | 2/2011 | Smilde et al. | |
| 2011/0069292 A1 | 3/2011 | Den Boef | |
| 2011/0102753 A1 | 5/2011 | Van De Kerkhof et al. | |
| 2012/0044470 A1 | 2/2012 | Smilde et al. | |
| 2012/0123581 A1 | 5/2012 | Smilde et al. | |
| 2012/0303151 A1 | 11/2012 | Ye et al. | |
| 2013/0059240 A1* | 3/2013 | Van Der Schaar ........ | G03F 7/70633 430/30 |
| 2013/0258310 A1 | 10/2013 | Smilde et al. | |
| 2013/0271740 A1 | 10/2013 | Quintanilha | |
| 2015/0046118 A1 | 2/2015 | Pandev et al. | |
| 2015/0186582 A1* | 7/2015 | Chen .................. | G06F 17/5068 716/54 |
| 2016/0041479 A1 | 2/2016 | Tanizaki | |

FOREIGN PATENT DOCUMENTS

| | | |
|---|---|---|
| WO | 2013178422 | 12/2013 |
| WO | 2014082938 | 6/2014 |
| WO | 2015131969 | 9/2015 |
| WO | 2016202560 | 12/2016 |
| WO | 2017016839 | 2/2017 |
| WO | 2017045871 | 3/2017 |

OTHER PUBLICATIONS

Korean Office Action issued in corresponding Korean Patent Application No. 10-2018-7028809, dated Mar. 25, 2020.
Chinese Office Action issued in corresponding Chinese Patent Application No. 201780023568.7, dated Mar. 3, 2020.

* cited by examiner

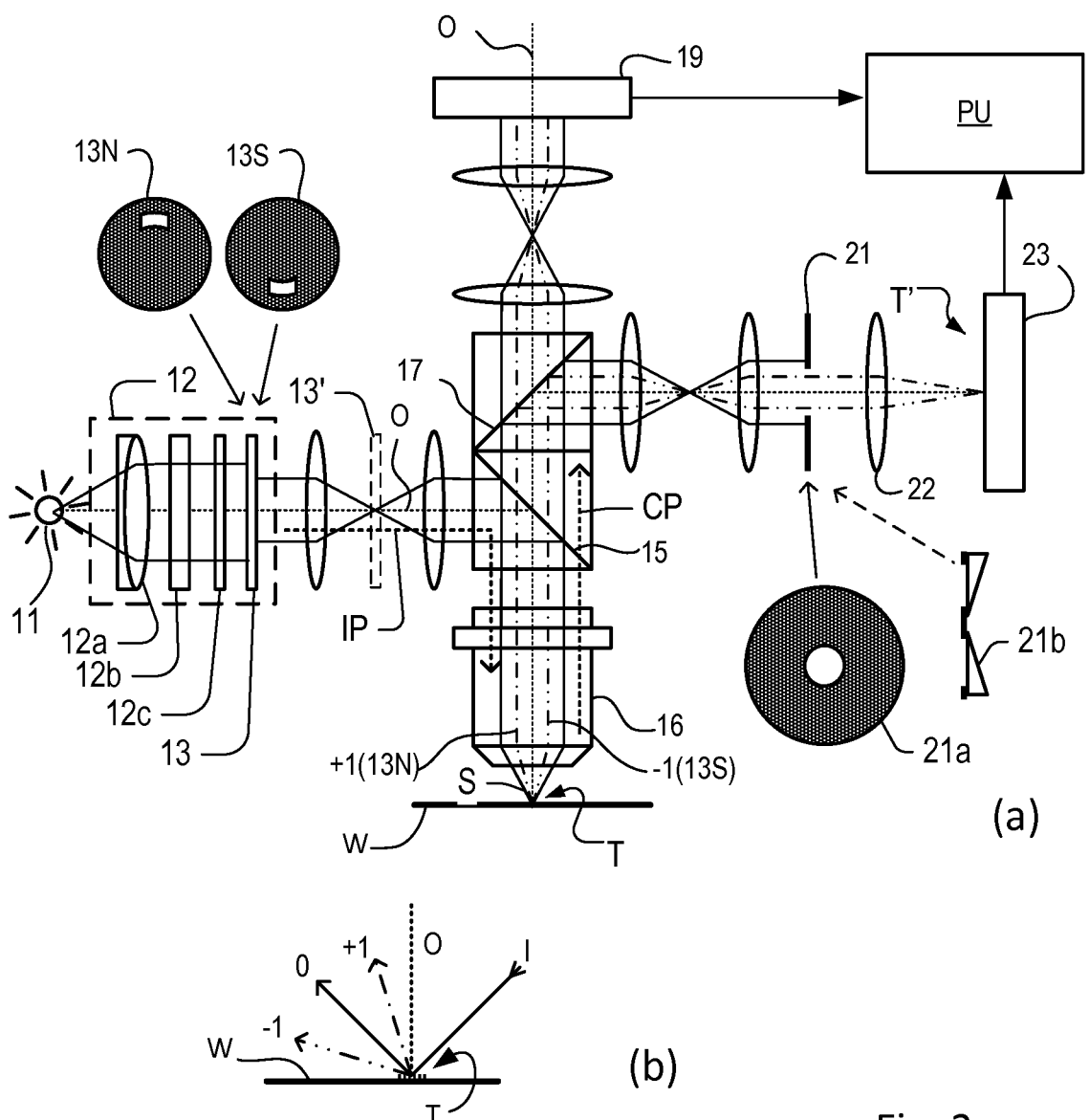
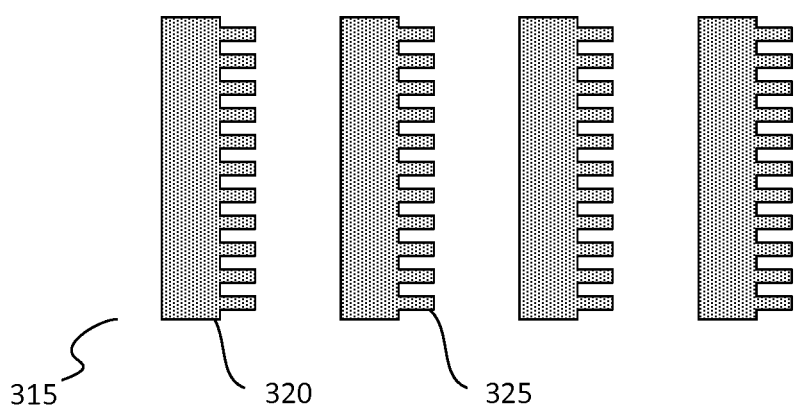
Fig. 2
Fig. 3

METHOD FOR ADJUSTING ACTUATION OF A LITHOGRAPHIC APPARATUS

CROSS-REFERENCE TO RELATED APPLICATIONS

This application is the U.S. national phase entry of PCT patent application no. PCT/EP2017/057971, which was filed on Apr. 4, 2017, which claims the benefit of priority of European patent application no. 16165605.3, which was filed on Apr. 15, 2016, and which are incorporated herein in its entirety by reference.

FIELD

The present invention relates to a method of adjusting actuation of a lithographic apparatus. In particular, the present invention relates to a method for determining a metrology signal for a patterning parameter.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1. The targets used by such scatterometers are relatively large, e.g., 40 μm by 40 μm, gratings and the measurement beam generates a spot that is smaller than the grating (i.e., the grating is underfilled). Examples of dark field imaging metrology can be found in international patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20130258310A, US20130271740A and WO2013178422A1. These targets can be smaller than the illumination spot and may be surrounded by product structures on a wafer. Multiple gratings can be measured in one image, using a composite grating target. The contents of all these applications are also incorporated herein by reference.

One important parameter of a lithographic process which requires monitoring is focus. There is a desire to integrate an ever-increasing number of electronic components in an IC. To realize this, it is necessary to decrease the size of the components and therefore to increase the resolution of the projection system, so that increasingly smaller details, or line widths, can be projected on a target portion of the substrate. As the critical dimension (CD) in lithography shrinks, consistency of focus, both across a substrate and between substrates, becomes increasingly important. CD is the dimension of a feature or features (such as the gate width of a transistor) for which variations will cause undesirable variation in physical properties of the feature. Traditionally, optimal settings were determined by "send-ahead wafers" i.e. substrates that are exposed, developed and measured in advance of a production run. In the send-ahead wafers, test structures are exposed in a so-called focus-energy matrix (FEM) and the best focus and energy settings are determined from examination of those test structures.

However, this method of determining focus is disadvantageous since it requires the use of the "send-ahead wafers" in order to change the focus of the lithographic apparatus. This either interrupts or delays subsequent production runs, which in turn decreases the throughput of the lithographic apparatus. Additionally, the "send-ahead wafers" may not be subjected to the same processes as product substrates. This means that any process-induced deformations or defects on the "send-ahead wafers" are not identical to those formed on the product substrates. Using the known method, it is not possible to accurately correct for this.

A further disadvantage to the known method is that a focus setting selected for a particular substrate (or batch of substrates) is based on data from previous substrates or batches of substrates. This means that any changes between a particular batch of substrates and the following batch of substrates cannot be taken into account. This may lead to focus errors that cannot be corrected.

Furthermore, it may not be possible to use the above method of determining focus across the entirety of a substrate surface, which is disadvantageous.

SUMMARY

According to a first aspect of the invention, there is provided a method of adjusting actuation of a lithographic apparatus for applying a pattern onto a first part of a substrate, the method comprising a step of:

obtaining a functional relationship between a first metrology signal and a second metrology signal, the first metrology signal representing a first patterning parameter and the second metrology signal representing a second patterning parameter;

obtaining a third metrology signal representing the first patterning parameter associated with the first part of the substrate; and determining a fourth metrology signal representing the second patterning parameter associated with the first part of the substrate from the third metrology signal and the functional relationship.

According to a second aspect of the invention, there is provided a method of adjusting actuation of a lithographic apparatus for applying a pattern onto a first part of a substrate, the method comprising a step of:

training a functional relationship between a first metrology signal and a second metrology signal, the first metrology signal representing a first patterning parameter of a reference substrate and the second metrology signal representing a second patterning parameter of the reference substrate;

obtaining a third metrology signal representing the first patterning parameter associated with the first part of the substrate; and determining a fourth metrology signal representing the second patterning parameter associated with the first part of the substrate based on the third metrology signal and the trained functional relationship.

The invention yet further provides a lithographic apparatus comprising means for carrying out the method as set forth above.

The invention yet further provides a computer program product containing one or more sequences of machine-readable instructions for implementing creating or using steps in a method according to the invention as set forth above.

The invention yet further provides a method of manufacturing a device, wherein the method comprises determining a metrology signal in a method as set forth above, and using the determined metrology signal to adjust actuation of the lithographic apparatus when applying a pattern onto a substrate.

Further aspects, features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 2 illustrates schematically an inspection apparatus adapted to perform angle-resolved scatterometry and dark-field imaging inspection methods;

FIG. 3 depicts target forming elements on a reticle suitable for forming a grating on a substrate having focus dependent asymmetry;

DETAILED DESCRIPTION OF EXEMPLARY EMBODIMENTS

Before describing embodiments of the invention in detail, it is instructive to present an example environment in which embodiments of the present invention may be implemented.

Figure 1:
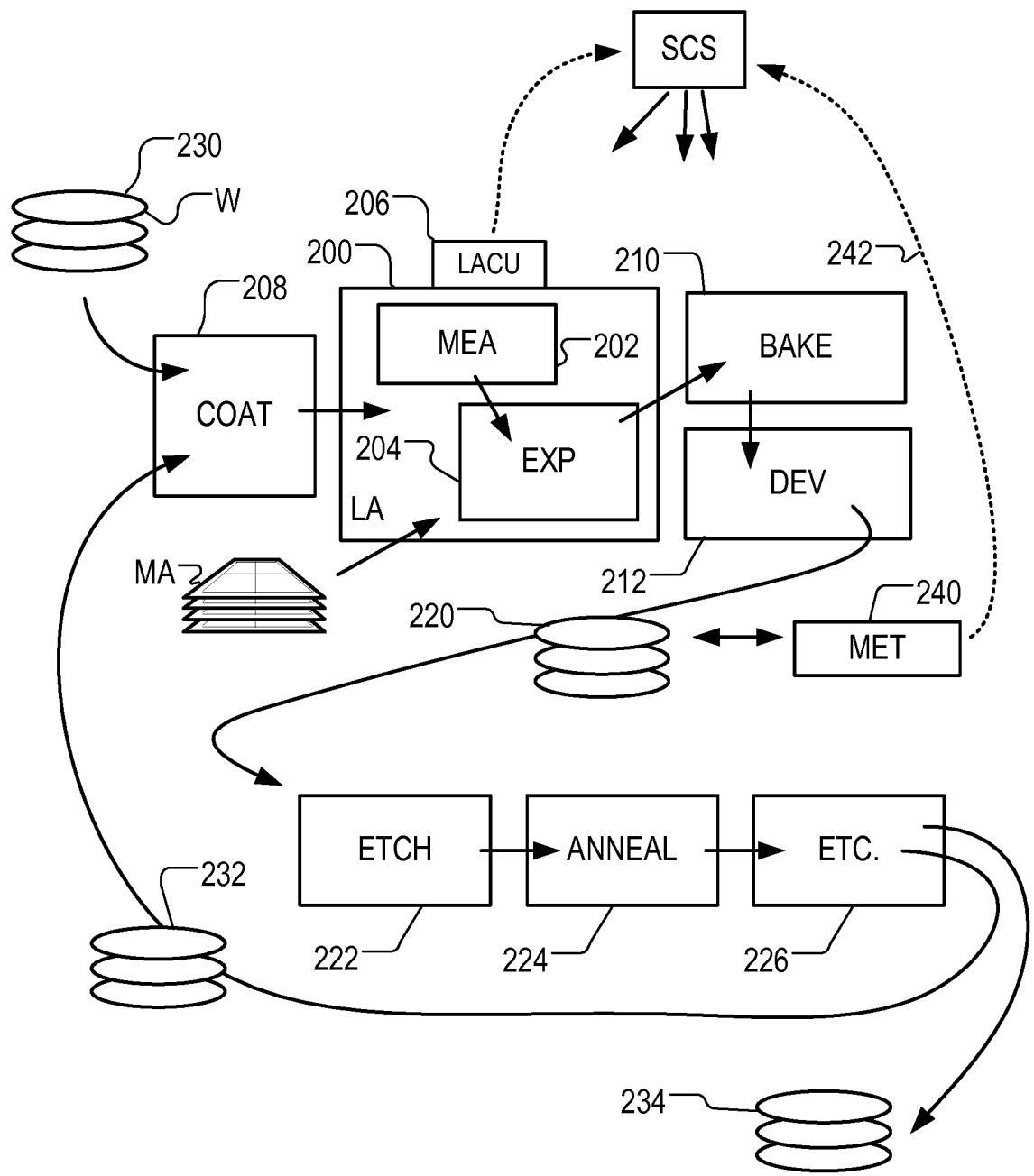
FIG. 1 depicts a lithographic apparatus together with other apparatuses forming a production facility for semiconductor devices.

FIG. 1 at 200 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 200 for short), a measurement station MEA is shown at 202 and an exposure station EXP is shown at 204. A control unit LACU is shown at 206. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU which controls all the movements and measurements of various actuators and sensors to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a sub-system or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA may for example is of a so-called dual stage type which has two substrate tables WTa and WTb and two stations—an exposure station and a measurement station—between which the substrate tables can be exchanged.

Once the pattern has been applied and developed in the litho cell, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system SCS. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by supervisory control system SCS and/or control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

FIG. 2(a) shows an inspection apparatus implementing angle-resolved scatterometry with adaptations for performing so-called dark field imaging. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating T and diffracted rays are illustrated in more detail in FIG. 2(b).

In this type of inspection apparatus, radiation emitted by a radiation source 11 is conditioned by an illumination system 12. For example, illumination system 12 may include a collimating using lens system 12a, a color filter 12b, a polarizer 12c and an aperture device 13. The conditioned radiation follows an illumination path IP, in which it is reflected by partially reflecting surface 15 (e.g. a beam splitter) and focused into a spot S on substrate W via a microscope objective lens 16. A metrology target T may be formed on substrate W. Lens 16, has a high numerical aperture (NA), preferably at least 0.9 and more preferably at least 0.95 Immersion fluid can be used to obtain with numerical apertures over 1 if desired.

The illumination path is labeled IP. A second partially reflecting surface 17 (e.g. a beam splitter) divides the collection path into two branches. In a first measurement branch, detector 19 records a scatter spectrum or diffraction spectrum of the target exactly as described above. This detector 19 may be referred to as the pupil image detector.

In the second measurement branch, imaging optical system 22 forms an image of the target on the substrate W on sensor 23 (e.g. a CCD or CMOS sensor). An aperture stop 21 is provided in a plane that is in the collection path CP in a plane conjugate to the pupil-plane (it may also be called a pupil stop). Aperture stop 21 can take different forms, just as the illumination aperture can take different forms. Typically, aperture stop 21 functions to block the zeroth order diffracted beam so that the image T' of the target formed on sensor 23 is formed only from the first order beam(s). This is the so-called dark field image, equivalent to dark field microscopy. The images captured by sensors 19 and 23 are output to image processor and controller PU, the function of which will depend on the particular type of measurements being performed.

In the illumination path in this example, additional optics are shown such that a field stop 13' can be placed in a plane conjugate with the plane of the target and the image sensor 23. This plane may be referred to as a field plane, or conjugate image plane, and has the property that each spatial position across the field plane corresponds to a position across the target. This field stop may be used for example to shape the illumination spot for a particular purpose, or simply to avoid illuminating features that are within the field of view of the apparatus but not part of the target of interest. The following drawings and discussion refer, by way of example, to techniques for implementation of the function of aperture device 13, but the present disclosure also encompasses use of the same techniques to implement the function of field stop 13'.

As shown in more detail in FIG. 2(b), target grating T is placed with substrate W normal to the optical axis O of objective lens 16. In the case of an off-axis illumination profile, a ray of illumination I impinging on grating T from an angle off the axis O gives rise to a zeroth order ray (solid line O) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

Different modes of illumination are possible by using different apertures. Apertures 13N ('north') and 13S ('south') each provide off-axis illumination from a specific narrow range of angles only. Returning to FIG. 2(a), this is illustrated by designating diametrically opposite portions of the annular aperture as north (N) and south (S). The +1 diffracted rays from the north portion of the cone of illumination, which are labeled +1 (13N), enter the objective lens 16, and so do the −1 diffracted rays from the south portion of the cone (labeled −1 (13S)). As described in the prior applications mentioned in the introduction, using the darkfield imaging sensor 23 while switching between apertures 13N, 13S of this type is one way of obtaining asymmetry measurements from multiple small targets. Aperture stop 21a can be used to block the zeroth order radiation when using off-axis illumination.

While off-axis illumination is shown, on-axis illumination of the targets may instead be used and an aperture stop with an off-axis aperture is used to pass substantially only one first order of diffracted light to the sensor. In one example, prisms 21b are used in place of aperture stop 21 which have the effect of diverting the +1 and −1 orders to different locations on sensor 23 so that they can be detected and compared without making two images. This technique, is disclosed in the above-mentioned published patent application US2011102753A1, the contents of which are hereby incorporated by reference. 2nd, 3rd and higher order beams (not shown in FIG. 2) can be used in measurements, instead of or in addition to the first order beams.

When monitoring a lithographic process, it is desirable to monitor a lithographic process parameter such as focus of the lithography beam on the substrate. One known method of determining the focus setting from a printed structure is by measuring the critical dimension (CD) of the printed structure. CD is a measure of the smallest feature (e.g., line width of an element). The printed structure may be a target, such as a line-space grating, formed specifically for focus monitoring. It is known that CD usually displays $2^{nd}$ order response to focus, forming what is known as a "Bossung curve" on a plot of CD (y-axis) against focus (x-axis). A Bossung curve is a substantially symmetrical curve which is substantially symmetrical around a peak representing the best focus. The Bossung curve may be substantially parabolic in shape. There are several drawbacks to this approach. One drawback is that the method shows low sensitivity near best focus (due to the parabolic shape of the curve). Another drawback is that the method is insensitive to the sign of any defocus (as the curve is largely symmetrical around best focus). Also this method is sensitive to inter alia dose and process variation (crosstalk).

To address these issues, diffraction based focus (DBF) was devised. Diffraction based focus may use target forming features on the reticle which print targets having a degree of asymmetry which is dependent on the focus setting during printing. This degree of asymmetry can then be measured using a scatterometery based inspection method, for example by measuring the intensity asymmetry between the intensities of $+1^{st}$ and $-1^{st}$ order radiation diffracted from the target, to obtain a measure of the focus setting.

FIG. 3 illustrates DBF target forming design 315 configured for diffraction based focus measurements. It comprises plural DBF structures 320, each of which comprises high resolution substructures 325. The high resolution substructures 325 on top of a base pitch creates an asymmetric resist profile for each DBF structure 320, with the degree of asymmetry being dependent upon focus. Consequently a metrology tool can measure the degree of asymmetry from a target formed using DBF target forming design 315 and translate this into the scanner focus.

While the DBF target forming design 315 enables diffraction based focus measurements, it is not suitable for use in all situations. Such structures may not comply with the strict design constraints applicable to certain product structures. During the chip making process all features on the reticle must print and stand up to subsequent processing steps. Semiconductor manufacturers use design rules as a means to restrict the feature designs to ensure the printed features conform to their process requirements. An example of such a design rule relates to the allowable size of structures or pitches. Another example design rule relates to pattern density, which may restrict the density of a resulting resist pattern to be within a particular range.

Figure 4:
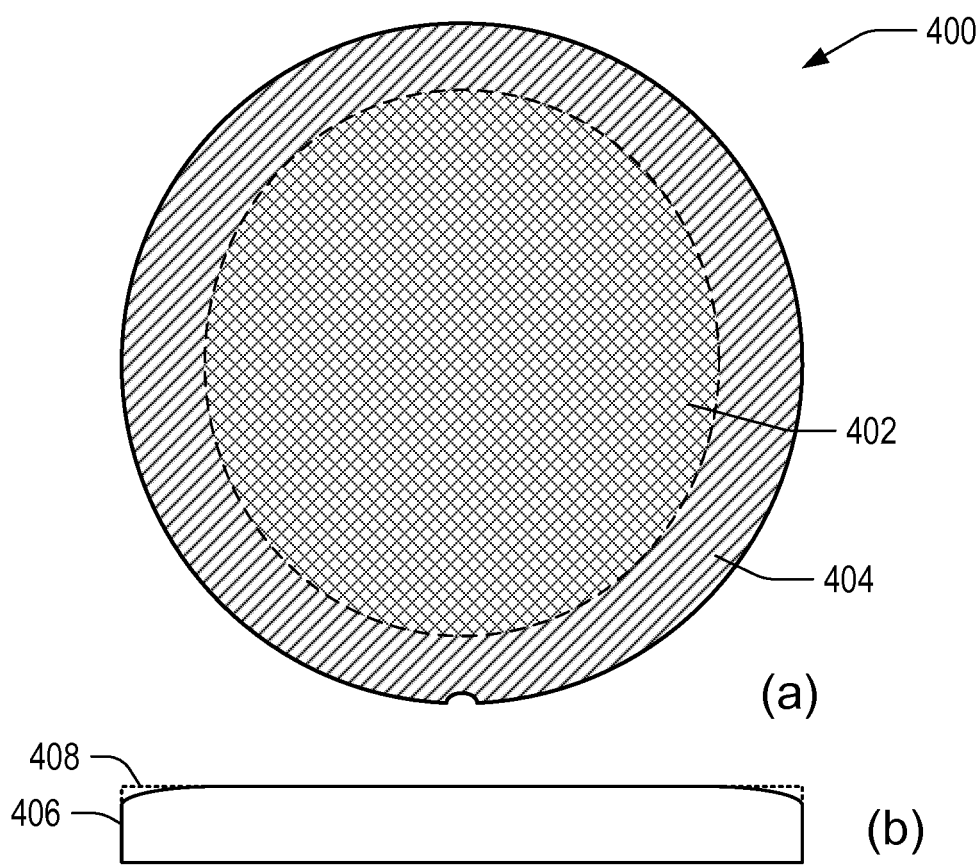
FIG. 4 illustrates an exemplary substrate.

One disadvantage of the above-described method for performing focus measurements is that it may not be possible to reliably perform such measurements on certain portions of a substrate. For example, near the edges of certain substrates, it is not always possible to reliably perform focus measurements. This is illustrated in FIG. 4(*a*), which illustrates cross section of an exemplary substrate 400. In a central portion 402 of the substrate, focus can be determined as described above. However, in an edge portion 404 of the substrate nearer the edges of the substrate it is not possible to measure the focus and determine a focus setting for the lithographic apparatus.

Under ideal circumstances, it can be assumed that any focus setting determined for the central portion of a substrate is also usable in the edge portion. However, in reality substrates are influenced by edge-related effects, which may for example cause substrates to be deformed near the edges. FIG. 4(*b*) illustrates one such exemplary situation, where edge roll-off causes the profile of a substrate 406 to differ from the ideal substrate 408. In order to select an accurate focus setting for the lithographic apparatus, it is necessary to take any edge-related effects into account (i.e. the edge roll-off in the present example). If the same focus setting selected for the central portion of the substrate is used for the edge portion, the quality of any structures patterned on the edge portion may be negatively impacted.

In the known method described above, the focus setting to be used is determined by a comparison between the focus measurement results and pre-determined calibration data. The calibration data is obtained by performing measurements on a set of calibration substrates. As calibration substrates are not subjected to the same processes and procedures as product substrates, any process-induced deformations or defects on the calibration substrates will not be identical to products substrates. In the known method it is not possible to correct for this.

An additional disadvantage to the known method is that a focus setting selected for a particular substrate (or batch of substrates) is based on data from previous substrates or batches of substrates. This means that any changes between a particular batch of substrates and the following batch of substrates cannot be taken into account. This may lead to focus errors that cannot be corrected.

It has been found that there is a correlation between focus measurements and measurement results obtained using the level sensor of the lithographic apparatus. As described above, the level sensor of the lithographic apparatus maps the surface height (which in the art may be referred to as a "wafer map" or "height map") of all layers of a substrate in a known manner. Each layer patterned onto a substrate is measured individually during the lithographic process. The measurement results are then used to create the height map in a suitable fashion. As each layer is measured, a height map each of the layers of the entire substrate is created. However, unlike the focus measurements described above, the level sensor is able to measure the entirety of the surface of the substrate.

It is to be noted that, while focus measurements and level measurements have been described in the above, the exemplary method as described in the following may, in principle, be applied to other patterning parameters of a lithographic apparatus. For example, a correlation between overlay error measurements and level measurements has also been observed, as overlay error is determined based on asymmetry measurements. As such, it will be realized that any specific references to focus measurements in the following are merely exemplary and not limiting.

Figure 5:
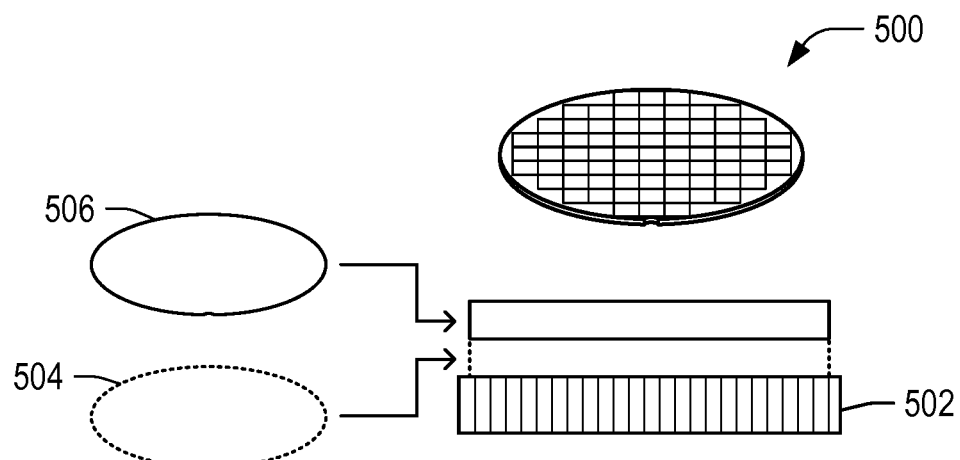
FIG. 5 is a schematic diagram of an exemplary substrate with first and second layers.

An exemplary substrate 500 is illustrated in FIG. 5. The substrate may have a number of patterns or layers applied to the surface of the substrate 502. In the present example, a first layer 504 and a second layer 506 have been deposited onto the surface of the substrate. It is of course to be noted that two layers are shown for exemplary purposes only, and that other substrates, e.g. substrates with product patterns, may comprise any suitable number of layers.

Figure 6:
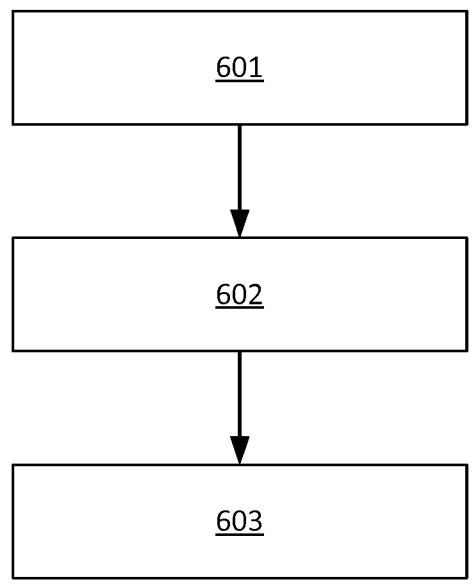
FIGS. 6 and 7 illustrate an exemplary method in accordance with a first embodiment of the invention.

A first exemplary method will now be discussed with reference to FIGS. 6 and 7. In a first step 601, a functional relationship between a first metrology signal and a second metrology signal is obtained, the first metrology signal representing a first patterning parameter and the second metrology signal representing a second patterning parameter. For example, the functional relationship may be obtained based on first 704 and second 706 metrology signals obtained from a substrate 702. In one example, the first metrology signal represents local height deviations across the substrate. In one example, the first metrology signal comprises a first portion comprising first height data for a first layer of the substrate, and a second portion comprising second height data for a second layer of the substrate. In another example, the second metrology signal represents focus information for the substrate, such as a determined focus amount. In yet another example, the second metrology signal represents information relating to overlay error, e.g. a determined overlay error based on one or more asymmetry measurements.

Figure 7:
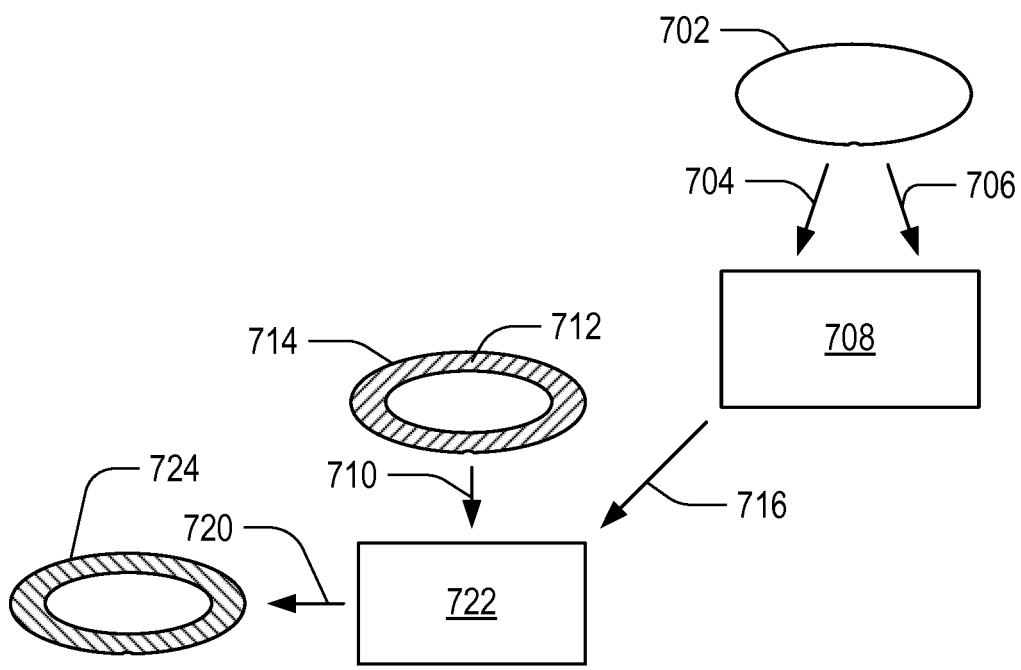

It is to be noted that, although only one substrate is shown in FIG. 7, this is for exemplary purposes only. The first and second metrology signals could equally well be obtained from a plurality of substrates. In an example, the one or more substrates are reference or calibration substrates. The calibration substrate may, for example, be part of a "calibration batch" or "calibration lot". In another example, the one or more substrates are product substrates patterned with product structures. In yet another example, the functional relationship are obtained based on measurements performed on a single substrate. It will of course be appreciated that a number of additional procedural steps (not shown for purposes of clarity), such as additional calculations or data transformations, may be carried out on the first and second metrology signals before obtaining the functional relationship.

The step of obtaining a functional relationship may be carried out in advance of or remotely from the subsequent method steps. In one example, the reference substrate is a product substrate that is part of the same batch as the substrate, which is processed prior to the substrate being processed. In another example, the step of obtaining a functional relationship is carried out both prior to and remotely from the remaining steps.

The functional relationship may be obtained in any suitable fashion, such as (but not limited to) machine learning algorithms or statistical methods. For example, the functional relationship may be determined by a processing unit 708.

In one example, the exemplary method additionally comprises a step of obtaining the first metrology signal. In another example, the method further comprises a step of obtaining the second metrology signal. Both of the first and second metrology signals may be obtained in any suitable fashion. In the example mentioned above, the first metrology signal comprises local height deviations across the substrate and is determined as described above. In this example, the second metrology signal represents focus information, which may be determined as described above.

In a second step 602, a third metrology signal 710 representing the first patterning parameter associated with a first part 712 of a substrate 714 is obtained. In one example, the substrate 714 is part of a batch or "lot" of substrates to which substrate 702 also belongs. In another example, substrate 702 is a reference or calibration substrate and substrate 714 is a product substrate. In yet another example, substrate 702 and substrate 714 is the same substrate.

In one example, similarly to the first metrology signal, the third metrology signal comprises first height data for a first layer of the substrate. In a further example, the third metrology signal additionally comprises second height data for a second layer of the substrate.

In a third step 603, a fourth metrology signal 720 representing the second patterning parameter associated with the first part of the substrate is obtained from the third metrology signal and the functional relationship (indicated by arrow 716). The fourth metrology signal may be obtained in any suitable fashion. In one example, it is determined by a processing unit 722. In one example, the fourth metrology signal represents focus information for the first part of the substrate 724.

In addition to the above-described steps, the exemplary method may comprise a step of deriving correction parameters, for use in controlling a lithographic apparatus to apply a product pattern to a plurality of fields on a product substrate, based on the determined fourth metrology signal.

Figure 8:
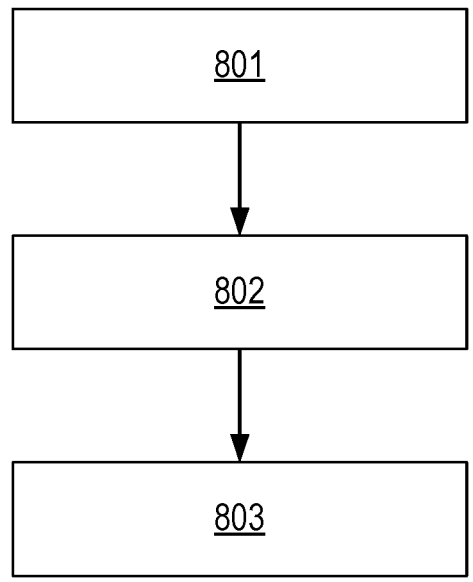
FIGS. 8 and 9 illustrate an exemplary method in accordance with a second embodiment of the invention.

A second exemplary method 800 of adjusting an actuation of a lithographic apparatus for applying a pattern onto a part of a substrate will now be described with reference to FIGS. 8 and 9.

In a first step 801, a functional relationship between a first metrology signal 904 and a second metrology signal 906 is trained, wherein the first metrology signal represents a first patterning parameter of a reference substrate 902, and the second metrology signal represents a second patterning parameter of the reference substrate. In the present example, the first metrology signal represents local height deviations across the reference substrate. In one example, the first metrology signal comprises a first portion comprising first height data for a first layer of the substrate, and a second portion comprising second height data for a second layer of the substrate. In another example, the first metrology signal may comprise only one of the first height data or the second height data. In another example, the first metrology signal comprises more than two portions, each of the portions comprising height data from a separate layer of the reference substrate.

In another example, the second metrology signal represents focus information, such as a determined focus amount. In yet another example, the second metrology signal represents information relating to overlay error, e.g. a determined overlay error based on one or more asymmetry measurements. It will of course be appreciated that a number of procedural steps (not shown for purposes of clarity), such as additional calculations or data transformations, may be carried out on the first and second metrology steps before obtaining the functional relationship.

The step of obtaining a functional relationship may be carried out prior to the subsequent method steps. In one example, the reference substrate is a product substrate part of the same batch as the substrate, which is processed prior to the substrate being processed. In another example, the step of obtaining a functional relationship is carried out both prior to and remotely from the remaining steps.

Figure 9:
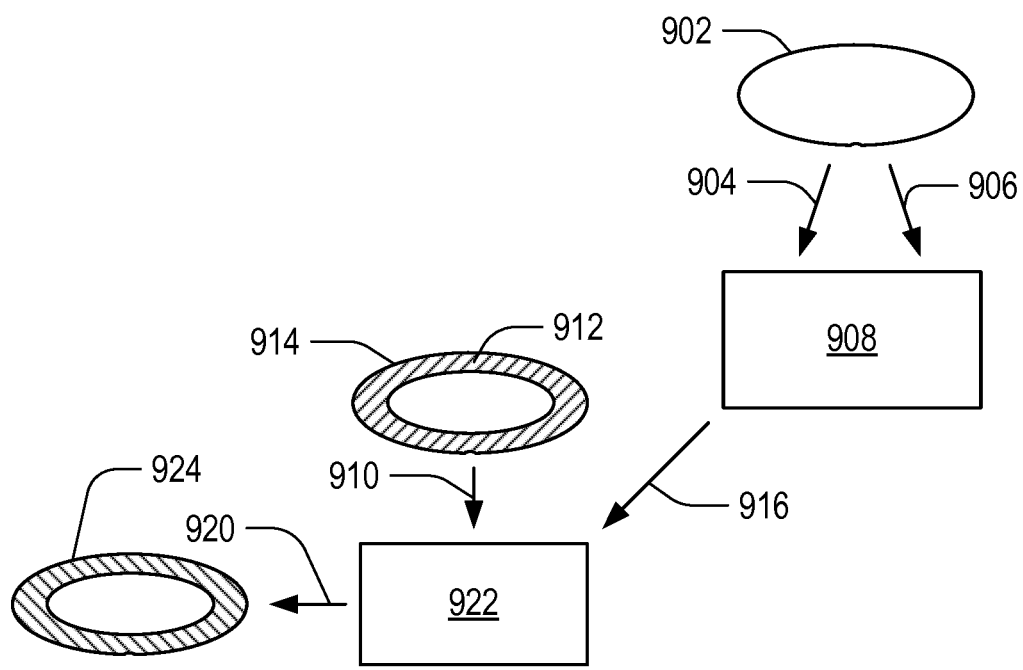

It is to be noted that, although only one reference substrate is shown in FIG. 9, this is for exemplary purposes only. It is, in principle, possible to use any suitable or desired number of reference substrates. In one example, a plurality of reference substrates, such as a batch or "lot" of calibration substrates, are used. In another example, metrology signals from previous product substrates is used in place of, or in addition to, metrology signals from calibration substrates. In a particular example, the reference substrate is a product substrate part of the same batch as the substrate, but which is processed prior to the substrate being processed.

The functional relationship may be obtained in any suitable fashion, such as (but not limited to) machine learning algorithms or statistical methods. For example, the functional relationship may be determined by a processing unit 908.

In one example, the exemplary method additionally comprises a step of obtaining the first metrology signal. In another example, the method comprises a step of obtaining the second metrology signal. Both of the first and second metrology signals may be obtained in any suitable fashion. In the example mentioned above, the first metrology signal comprises local height deviations across the substrate and is determined as described above. In this example, the second metrology signal comprises focus information, which may be determined as described above.

In a second step 802, a third metrology signal 910 representing the first patterning parameter associated with the first part 912 of a substrate 914 is obtained. In one example, the third metrology signal therefore represents local height deviations of the first part of the substrate. In another example, the third metrology signal comprises first height data for a first layer of the substrate. In a further example, the third metrology signal additionally comprises second height data for a second layer of the substrate.

In a third step 803, a fourth metrology signal 920 representing the second patterning parameter associated with the first part of the substrate is obtained from the third metrology signal 910 and the functional relationship (indicated by arrow 916). The fourth metrology signal may be obtained in any suitable fashion. In one example, it is determined by a processing unit 922. In one example, the fourth metrology signal represents focus information for the first part of the substrate 924.

In addition to the above-described steps, the exemplary method may comprise a step of deriving correction parameters, for use in controlling a lithographic apparatus to apply a product pattern to a plurality of fields on a product substrate, based on the determined fourth metrology signal.

It will be realized that a number of specific arrangements to implement the above-mentioned examples may be envisaged by the skilled person.

Figure 10:
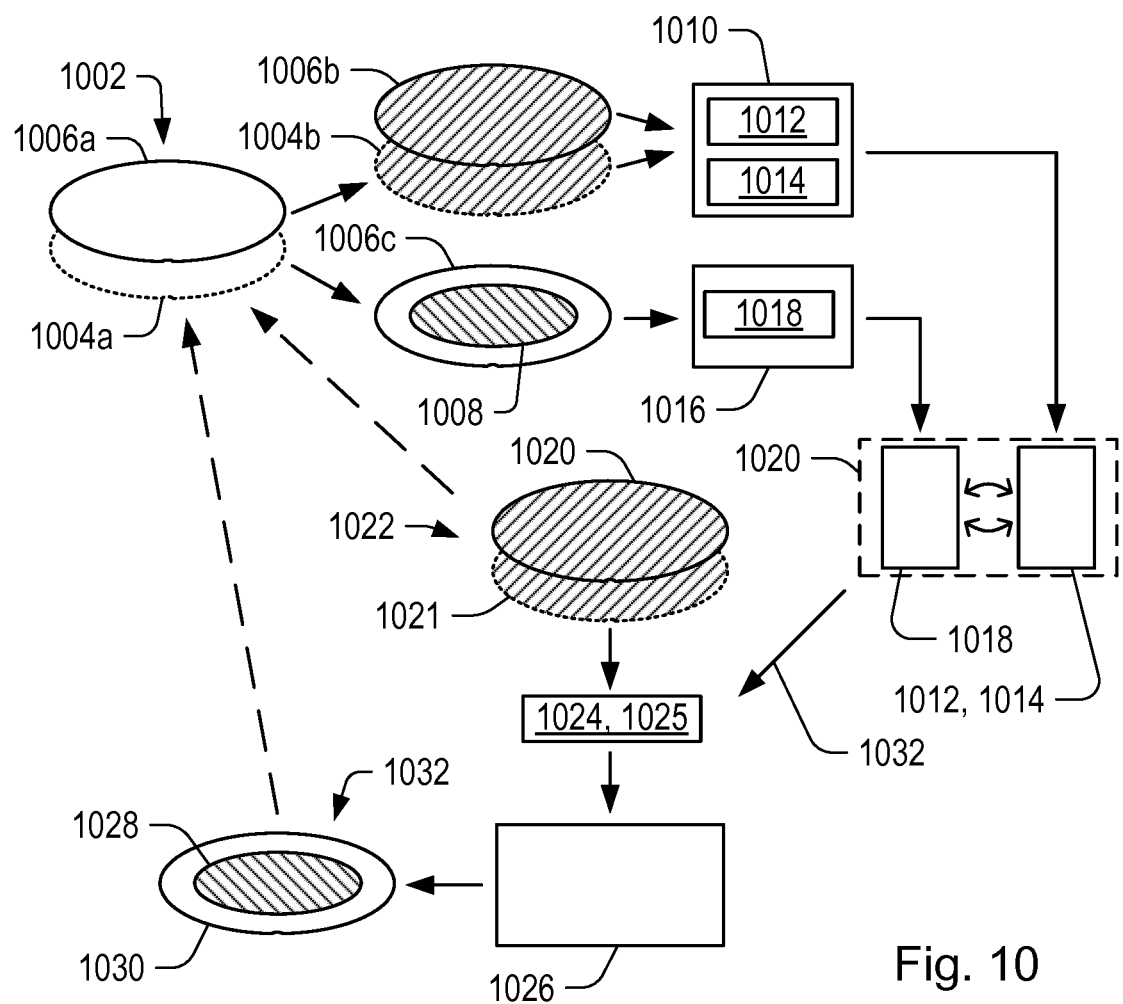
FIGS. 10 and 11 illustrate an exemplary method in accordance with a third embodiment of the invention.
Figure 11:
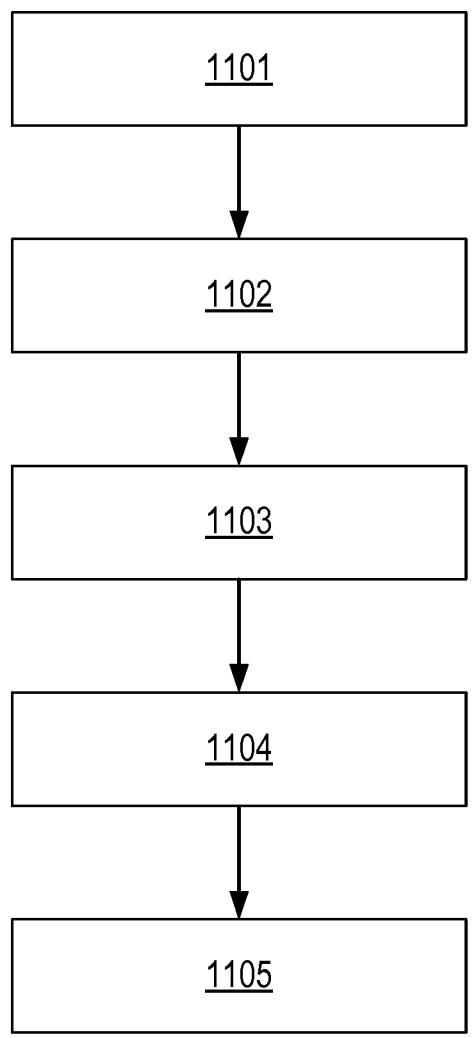

A third exemplary method will now be discussed with reference to FIGS. 10 and 11. For exemplary purposes only, a reference substrate 1002 similar to the substrate shown in FIG. 5 will be used to describe the exemplary method. The reference substrate has a first layer 1004*a* and a second layer 1006*a*. In other examples, substrates with a larger number of layers may be used.

In the present example, the reference substrate is a calibration substrate used to calibrate a lithographic apparatus. In other examples, the substrate may be a product substrate onto which product patterns have been applied.

In a first step 1101, a level sensor (not shown) maps the surface height of the first layer 1004*b* of the reference substrate. As shown, the entirety of the surface of the first layer of the reference substrate is mapped. In the first step, the level sensor additionally maps the surface height of a second layer 1006*b* of the reference substrate. It will of course be realized that the first step as described above is exemplary only. It is possible that other specific method steps may be performed as part of the first step.

The first surface height data for the first layer and second surface height data for the second layer are subsequently sent to a processing unit 1010. Based on the mapped surface heights, a first height map 1012 is created for the first layer of the reference substrate, and a second height map 1014 is created for the second layer of the reference substrate. The height maps may be created in any suitable fashion, such as for example described above.

In a second step 1102, a focus measurement is performed on focus marks on the second layer 1006*c* of the reference substrate in the manner described above. As also described above, the focus measurement may be carried out for only part 1008 of the surface area of the second layer. The focus measurement data 1018 is sent to a processing unit 1016 where it is processed in a suitable manner.

In a third step 1103, the first height map 1012, second height map 1014 and focus measurement data 1018 are used to train a functional relationship. In the present example, the functional relationship is a function 1020 that describes the correlation between a height map for one or more layers and focus measurements for a particular layer.

Typically, the above-described method steps may be performed immediately prior to processing of product substrates commences. However, it is, in principle, equally possible to perform one or more of the above steps during processing of a batch or "lot" of product substrates. Alternatively, it is also possible to carry out some of the above steps before commencement of processing and to carry out the remainder during processing.

In a fourth step 1104, a level sensor is used to create a third height map 1024 and a fourth height map 1025 of the surface height of a first layer 1020 and a second layer 1021 of a substrate 1022 in a similar manner to the first and second steps described above. In the present example, the substrate is a substrate onto which product patterns have been applied. Accordingly, the height map of the substrate is created while the substrate is being processed in the lithographic apparatus.

It should be noted that the above third and fourth height maps are exemplary only. In principle, a height map comprising surface height data for any suitable or desired number of layers of the substrate 1022 could be used.

In a fifth step 1105, a processing unit 1026 determines a set of predicted focus data for at least a portion 1028 of the second layer 1030 of the second substrate 1032 based on the functional relationship and the third height map 1024. The predicted focus data may subsequently be used to adjust the settings of the lithographic apparatus during the patterning of the second layer.

Although specific reference has been made to focus measurements in the above examples, it will be realized that the principles discussed in these examples could equally well be applied to predicting other characteristics of a substrate or layers thereon. For example, as discussed above, the application of the above method and apparatus to predicting overlay error on one or more layers may easily be envisaged.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used in relation to the lithographic apparatus encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The embodiments may further be described using the following clauses:

1. A method of adjusting actuation of a lithographic apparatus for applying a pattern onto a first part of a substrate, the method comprising a step of:
obtaining a functional relationship between a first metrology signal and a second metrology signal, the first metrology signal representing a first patterning parameter and the second metrology signal representing a second patterning parameter;
obtaining a third metrology signal representing the first patterning parameter associated with the first part of the substrate; and
determining a fourth metrology signal representing the second patterning parameter associated with the first part of the substrate from the third metrology signal and the functional relationship.

2. A method according to clause 1, further comprising:
deriving correction parameters, for use in controlling a lithographic apparatus to apply a product pattern to a plurality of fields on a product substrate, based on the determined fourth metrology signal.

3. A method according to any preceding clause, further comprising a step of obtaining the first metrology signal.

4. A method according to any preceding clause, further comprising a step of obtaining the second metrology signal 5. A method according to any preceding clause, wherein the first metrology signal represents local height deviations across the substrate, and wherein the third metrology signal represents local height deviations across the first part of the substrate.

6. A method according to clause 5, wherein the first metrology signal comprises:
a first portion comprising first height data for a first layer of the substrate; and
a second portion comprising second height data for a second layer of the substrate.

7. A method according to clause 5 or 6, wherein the third metrology signal comprises first height data for a first layer of the substrate.

8. A method according to any of clauses 5 to 7, wherein the third metrology signal comprises second height data for a second layer of the substrate.

9. A method according to any preceding clause, wherein the second metrology signal represents focus information for the substrate, and wherein the fourth metrology signal represents focus information for the first part of the substrate.

10. A method of adjusting actuation of a lithographic apparatus for applying a pattern onto a first part of a substrate, the method comprising a step of:
training a functional relationship between a first metrology signal and a second metrology signal, the first metrology signal representing a first patterning parameter of a reference substrate and the second metrology signal representing a second patterning parameter of the reference substrate;
obtaining a third metrology signal representing the first patterning parameter associated with the first part of the substrate; and
determining a fourth metrology signal representing the second patterning parameter associated with the first part of the substrate based on the third metrology signal and the trained functional relationship.

11. A method according to clause 10, further comprising:
deriving correction parameters, for use in controlling a lithographic apparatus to apply a pattern to a plurality of fields on the substrate, based on the determined fourth metrology signal.

12. A method according to clause 10 or 11, further comprising a step of obtaining the first metrology signal.

13. A method according to clause 10, 11 or 12, further comprising a step of obtaining the second metrology signal 14. A method according any of clauses 10 to 13, wherein the first metrology signal represents local height deviations across the reference substrate, and wherein the third metrology signal represents local height deviations across the first part of the substrate.

15. A method according to clause 14, wherein the first metrology signal comprises:
a first portion comprising first height data for a first layer of the reference substrate; and
a second portion comprising second height data for a second layer of the reference substrate.

16. A method according to clause 14 or 15, wherein the third metrology signal comprises first height data for a first layer of the substrate.

17. A method according to any of clauses 14 to 16, wherein the third metrology signal comprises second height data for a second layer of the substrate.

18. A method according to any of clauses 10 to 17, wherein the second metrology signal represents focus information for the substrate, and wherein the fourth metrology signal represents focus information for the first part of the substrate.

19. A lithographic apparatus comprising means for carrying out the method of any of clauses 1 to 18.

20. A computer program product comprising machine readable instructions which, when run on a suitable processor, cause the processor to perform the creating and using steps of the method of any of clauses 1 to 18.

21. A method for manufacturing a device using a lithographic device, the method comprising:
determining a fourth metrology signal by the method of any of clauses 1 to 18; and
using the determined metrology signal to adjust actuation of the lithographic apparatus when applying a pattern onto a substrate.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of adjusting actuation of a lithographic apparatus for applying a pattern onto a part of a substrate, the method comprising:
obtaining a functional relationship between a first metrology signal and a second metrology signal, the first metrology signal representing a first patterning parameter and the second metrology signal representing a second patterning parameter;
obtaining a third metrology signal representing the first patterning parameter associated with the part of the substrate;
determining, by a hardware computer system, a fourth metrology signal representing the second patterning parameter associated with the part of the substrate from the third metrology signal and the functional relationship; and
outputting the fourth metrology signal, or data derived therefrom, for use in or with a production process involving applying the pattern by the lithographic apparatus onto the substrate.

2. The method according to claim 1, further comprising deriving a correction parameter, for use in controlling a lithographic apparatus to apply a product pattern to a plurality of fields on a product substrate, based on the determined fourth metrology signal.

3. The method according to claim 1, further comprising obtaining the first metrology signal, and/or further comprising obtaining the second metrology signal.

4. The method according to claim 1, wherein the first metrology signal represents local height deviations across the substrate, and wherein the third metrology signal represents local height deviations across the part of the substrate.

5. The method according to claim 4, wherein the first metrology signal comprises;
a first portion comprising first height data for a first layer of the substrate; and
a second portion comprising second height data for a second layer of the substrate.

6. The method according to claim 4, wherein the third metrology signal comprises first height data for a first layer of the substrate, or wherein the third metrology signal comprises second height data for a second layer of the substrate.

7. The method according to claim 1, wherein the second metrology signal represents focus information for the substrate; and wherein the fourth metrology signal represents focus information for the part of the substrate.

8. A method of adjusting actuation of a lithographic apparatus for applying a pattern onto a part of a substrate, the method comprising:
- training, by a hardware computer system, a functional relationship between a first metrology signal and a second metrology signal, the first metrology signal representing a first patterning parameter of a reference substrate and the second metrology signal representing a second patterning parameter of the reference substrate;
- obtaining a third metrology signal representing the first patterning parameter associated with the part of the substrate;
- determining a fourth metrology signal representing the second patterning parameter associated with the part of the substrate based on the third metrology signal and the trained functional relationship; and
- outputting the fourth metrology signal, or data derived therefrom, for use with a production process involving applying the pattern by the lithographic apparatus onto the substrate.

9. The method according to claim 8, further comprising deriving a correction parameter, for use in controlling a lithographic apparatus to apply a pattern to a plurality of fields on the substrate, based on the determined fourth metrology signal.

10. The method according to claim 8, further comprising obtaining the first metrology signal, and/or further comprising obtaining the second metrology signal.

11. The method according to claim 8, wherein the first metrology signal represents local height deviations across the reference substrate, and wherein the third metrology signal represents local height deviations across the part of the substrate.

12. The method according to claim 11, wherein the first metrology signal comprises:
- a first portion comprising first height data for a first layer of the reference substrate, and
- a second portion comprising second height data for a second layer of the reference substrate.

13. The method according to claim 11, wherein the third metrology signal comprises first height data for a first layer of the substrate and/or wherein the third metrology signal comprises second height data for a second layer of the substrate.

14. The method according to claim 8, wherein the second metrology signal represents focus information for the substrate, and wherein the fourth metrology signal represents focus information for the part of the substrate.

15. A non-transitory computer program product comprising machine readable instructions which, when run on a suitable processor system, cause the processor system to at least:
- obtain a functional relationship between a first metrology signal and a second metrology signal, the first metrology signal representing a first patterning parameter and the second metrology signal representing a second patterning parameter;
- obtain a third metrology signal representing the first patterning parameter associated with a part of the substrate to which a pattern is, or has been, applied by a lithographic apparatus;
- determine a fourth metrology signal representing the second patterning parameter associated with the part of the substrate from the third metrology signal and the functional relationship; and
- output the fourth metrology signal, or data derived therefrom, for use with a production process involving applying the pattern by the lithographic apparatus onto the substrate.

16. The computer program product of claim 15, wherein the instructions are further configured to cause the processor system to train the functional relationship using a first metrology signal representing the first patterning parameter of a reference substrate and a second metrology signal representing the second patterning parameter of the reference substrate.

17. The computer program product of claim 15, wherein the instructions are further configured to cause the processor system to derive a correction parameter, for use in controlling a lithographic apparatus to apply a product pattern to a plurality of fields on a product substrate, based on the determined fourth metrology signal.

18. The computer program product of claim 15, wherein the instructions are further configured to cause the processor system to obtain the first metrology signal, and/or obtain the second metrology signal.

19. The computer program product of claim 15, wherein the first metrology signal represents local height deviations across the substrate, and wherein the third metrology signal represents local height deviations across the part of the substrate.

20. The computer program product of claim 15, wherein the first metrology signal comprises:
- a first portion comprising first height data for a first layer of the substrate; and
- a second portion comprising second height data for a second layer of the substrate.

21. A non-transitory computer program product comprising machine readable instructions which, when run on a suitable processor system, cause the processor system to at least:
- train a functional relationship between a first metrology signal and a second metrology signal, the first metrology signal representing a first patterning parameter of a reference substrate and the second metrology signal representing a second patterning parameter of the reference substrate;
- obtain a third metrology signal representing the first patterning parameter associated with a part of the substrate to which a pattern is, or has been, applied by a lithographic apparatus;
- determine a fourth metrology signal representing the second patterning parameter associated with the part of the substrate based on the third metrology signal and the trained functional relationship; and
- output the fourth metrology signal, or data derived therefrom, for use with a production process involving applying the pattern by the lithographic apparatus onto the substrate.

* * * * *